United States Patent
Shih et al.

(10) Patent No.: US 9,054,148 B2
(45) Date of Patent: Jun. 9, 2015

(54) METHOD FOR PERFORMING HOT WATER SEAL ON ELECTROSTATIC CHUCK

(75) Inventors: Hong Shih, Santa Clara, CA (US); Tuochuan Huang, Saratoga, CA (US); David Schaefer, Fremont, CA (US); Ambarish Chhatre, San Ramon, CA (US); John Daugherty, Fremont, CA (US); MingHang Wu, Renton, WA (US); Clifford La Croix, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/219,540

(22) Filed: Aug. 26, 2011

(65) Prior Publication Data

US 2013/0052339 A1    Feb. 28, 2013

(51) Int. Cl.
*B05D 5/12* (2006.01)
*H01L 21/683* (2006.01)
*B05D 7/00* (2006.01)
*C23C 22/66* (2006.01)
*C23C 8/02* (2006.01)

(52) U.S. Cl.
CPC ........ *H01L 21/6831* (2013.01); *H01L 21/6833* (2013.01); *B05D 7/52* (2013.01); *B05D 5/12* (2013.01); *C23C 22/66* (2013.01); *C23C 8/02* (2013.01)

(58) Field of Classification Search
USPC ............................... 427/140, 143, 337, 419.2
See application file for complete search history.

(56) References Cited

U.S. PATENT DOCUMENTS

| | | | |
|---|---|---|---|
| 3,152,970 A | 10/1964 | Jensen | |
| 3,440,150 A | 4/1969 | Kramer | |
| 3,486,991 A * | 12/1969 | Hatano et al. | 205/50 |
| 3,935,349 A * | 1/1976 | Terai et al. | 427/409 |
| 5,998,084 A * | 12/1999 | Elsaesser et al. | 430/165 |
| 7,052,553 B1 * | 5/2006 | Shih et al. | 134/1 |
| 7,166,205 B2 * | 1/2007 | Kuo et al. | 205/174 |
| 7,648,582 B2 * | 1/2010 | Steger | 134/1 |
| 2008/0032121 A1 * | 2/2008 | Lawlor | 428/335 |
| 2010/0088872 A1 * | 4/2010 | Shih | 29/402.01 |
| 2011/0155299 A1 * | 6/2011 | Hart et al. | 156/98 |
| 2012/0141661 A1 * | 6/2012 | Cho et al. | 427/58 |
| 2012/0154974 A1 * | 6/2012 | Bhatnagar et al. | 361/234 |

FOREIGN PATENT DOCUMENTS

KR        2005/064336        *    6/2005

OTHER PUBLICATIONS

Shane Thomas, ISR for PCT/IB12/54295, Feb. 22, 2013, pp. 110, United States Patent Office, United States.
International Preliminary Report on Patentability issued Mar. 4, 2014 for PCT/IB2012/054295.

* cited by examiner

*Primary Examiner* — Brian K Talbot
(74) *Attorney, Agent, or Firm* — Buchanan Ingersoll & Rooney PC

(57) ABSTRACT

A method is provided for treating a bipolar ESC having a front surface and a back surface, the front surface including an anodized layer. The method includes eliminating the anodized layer, disposing a new anodized layer onto the front surface, and treating the new anodized layer with water to seal the new anodized layer.

12 Claims, 3 Drawing Sheets

METHOD FOR PERFORMING HOT WATER SEAL ON ELECTROSTATIC CHUCK

BACKGROUND

Bipolar electrostatic chucks (ESCs or ESC for singular) are commonly used in semiconductor wafer fabrication. These ESCs use electrostatic forces to hold a semiconductor wafer in place during the manufacturing process. Over time, the chucks develop wear from use and their performance degrades.

Methods for refurbishing ESCs have been developed, however the known anodization process for refurbishment may present consistency issues associated with the dielectric constant for an anodized layer.

What is needed is a method for ESC refurbishment enabling fabrication of an anodized layer with a consistent dielectric constant.

BRIEF SUMMARY

The present invention provides a method for refurbishing an ESC with an anodized layer performed by application of a deionized water seal for supplying an anodized layer.

In accordance with an aspect of the present invention, a method is provided for treating a bipolar ESC having a front surface and a back surface, the front surface including an anodized layer. The method includes eliminating the anodized layer, disposing a new anodized layer onto the front surface, and treating the new anodized layer with water to seal the new anodized layer.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with aspects of the present invention, an anodized layer is removed from an ESC. A replacement anodized layer is then added to ESC. The new anodized layer is treated with hot water to eliminate pores therein. The hot water treated anodized layer is more resistant to corrosion and maintains consistent electromagnetic properties for longer periods than anodized layers that are not treated with hot water.

Figure 1:
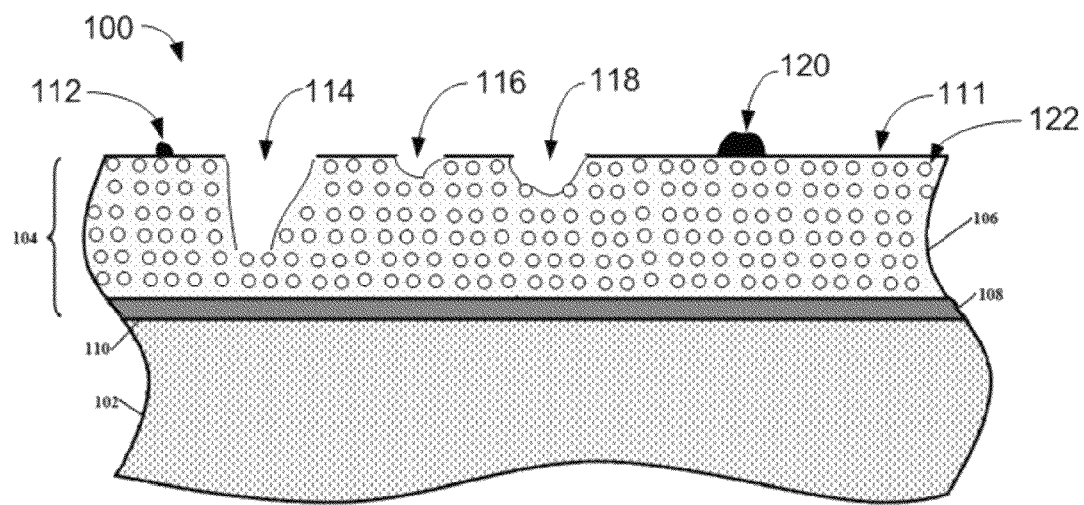
FIG. 1 illustrates a cross-sectional view of an exemplary ESC, in accordance with an aspect of the present invention.

FIG. 1 illustrates a cross-sectional view of a portion of an example ESC 100, to be refurbished in accordance with an aspect of the present invention.

As seen in the figure, ESC 100 includes an electrode 102 and an anodized layer 104. ESC 100 is used to hold a semiconductor wafer (not shown) in place during the manufacturing process via electrostatic attraction between the semiconductor wafer and ESC 100. Electrode 102 may be positively or negatively charged. The charge applied to electrode 102 is developed by applying a voltage difference between electrode 102 and a second electrode (not shown). Anodized layer 104 prevents unwanted oxidation of electrode 102.

Anodized layer 104 includes a porous layer 106 and a barrier layer 108. As a non-limiting example, porous layer 106 and barrier layer 108 may be formed of $Al_2O_3$. Anodized layer 104 resides on a top surface 110 of electrode 102. Barrier layer 108 resides between electrode 102 and porous layer 106 and resides on top surface 110. Typically, the thickness of barrier layer 108 is smaller than the thickness of porous layer 106. Furthermore, in general, the density of barrier layer 108 is greater than that of porous layer 106.

Anodizing an aluminum alloy such as $Al_2O_3$ produces a porous layer (e.g. porous layer 106) containing a high density of microscopic pores with a sampling denoted as a pore 122. As a result of the pores, the anodized aluminum alloy reacts readily or oxidizes with oxygen in air resulting in undesirable oxidation, i.e., corrosion. The resulting oxidation varies throughout the volume of the material producing variable electromagnetic properties (i.e. permittivity or $\in_0$ associated with electrical properties and permeability or $\mu_0$ associated with magnetic properties) for the material. The variable electromagnetic properties results in inconsistent operation and negatively affects the performance of an ESC for fabricating semiconductor wafers.

An ESC is used to hold wafers via an electrostatic attraction also known as chucking a wafer. Furthermore, wafers are released from an ESC via an electrostatic repulsion also known as de-chucking. As the electromagnetic properties (i.e. $\in_0$ and $\mu_0$) of an ESC begin to vary as a result of unwanted oxidation, the parameters associated with chucking and de-chucking a wafer also vary. Furthermore, due to the precision required for fabricating a semiconductor, the efficiency, effectiveness and ability to chuck and de-chuck a wafer is negatively affected as a result of unwanted oxidation and the undesirable variance associated with the electromagnetic properties distributed throughout the volume of $Al_2O_3$.

Furthermore, ESC 100 will wear over time by developing cracks, dents, pits, scratches and deep scratches. The degradation may occur as a result of surface conditions that may develop with use. Due to the physical defects associated with ESC 100, the processing of semiconductor wafers may be not be performed correctly, may not be performed sufficiently and/or may not be performed efficiently.

Several types of wear may develop for ESC 100. Particulate matter may stick to a top surface 111, with example particulate matter illustrated as a particulate matter 112 and a particulate matter 120. Scratches or marks may occur in anodized layer 104 with example scratches illustrated as a scratch 114, a scratch 116 and a scratch 118.

A wafer handling system, which uses ESC 100, is operated under very precise conditions. When the electromagnetic properties of ESC 100 change, the efficiency of the operation of the entire wafer handling system degrades. As such, it is important to maintain the electromagnetic properties of ESC 100. In order to maintain the electromagnetic properties of ESC 100, the issues resulting from operational wear over time should be addressed. Particulate matter 112 and 120 may be removed from the surface of ESC 100 by known methods, however scratches 114, 116 and 118 require more intensive repair.

ESC 100 with a damaged anodized layer 104 may be refurbished in order to restore its electromagnetic properties. The process of refurbishment of ESC 100 includes removal and replacement of anodized layer 104.

FIG. 1 illustrates a cross-sectional view of ESC 100, wherein anodized layer 104 has become physically damaged during operation. Anodized layer 104 may be removed and replaced in order to restore the electromagnetic properties of ESC 100. Removal and replacement of an anodized layer will be described with reference to FIGS. 2-3.

Figure 2:
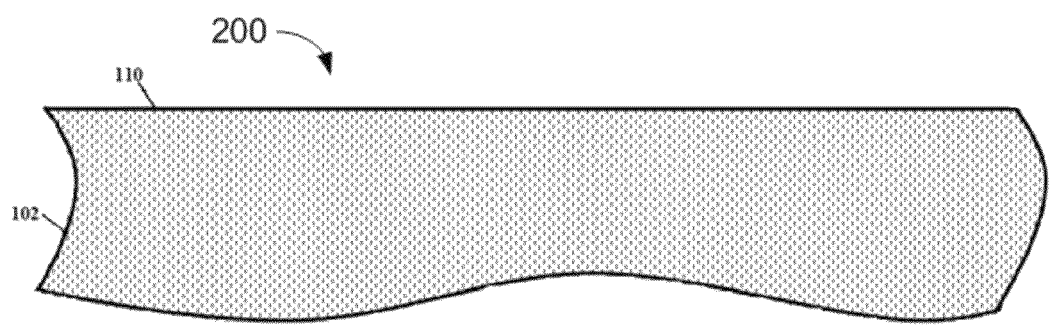
FIG. 2 illustrates a cross-sectional view of an exemplary partial ESC as described with reference to FIG. 1 where a layer portion has been removed, in accordance with an aspect of the present invention.

FIG. 2 illustrates a cross-sectional view of ESC 100 of FIG. 1, wherein anodized layer 104 has been removed. Removal of anodized layer 104 may be performed by any known method, non-limiting examples of which include lathing (stripping).

Anodized layer 104 may be accurately stripped with a controlled resolution of 30 seconds or less, followed by deionized water rinsing and measurement. Stripping is controlled in order to cease material removal process when previous anodic material has been removed. Top surface 110 is then polished to remove 1 to 2 mils of electrode 102. With the anodized layer removed, top surface 110 of electrode 102 is ready to receive a new anodized layer.

Figure 3:
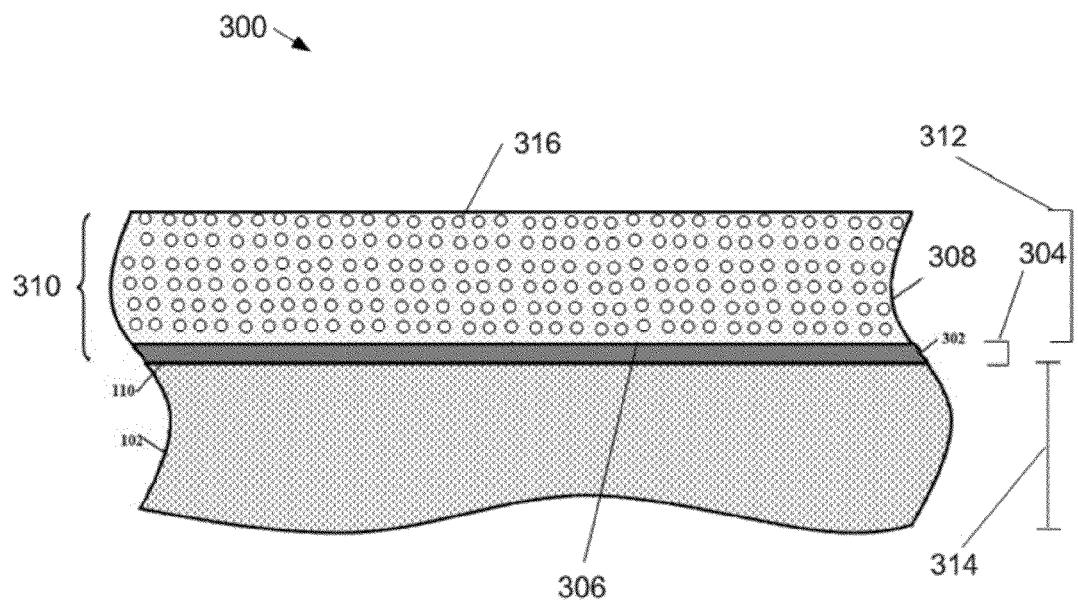
FIG. 3 illustrates a cross-sectional view of an example partially refurbished ESC wherein a defective or deformed layer portion has been replaced with a new layer portion, in accordance with an aspect of the present invention.

FIG. 3 illustrates a cross-sectional view of an example partially refurbished ESC 300, wherein a defective anodized layer has been replaced with a new anodized layer, in accordance with an aspect of the present invention.

Partially refurbished ESC 300 includes electrode 102, a barrier layer 302 and a layer 308. The term "partially" is used in partially refurbished ESC 300 because the ESC will not be completely refurbished, in accordance with aspects of the present invention, until the new anodized layer is treated with hot water. This will be described later.

Layer 308 forms on top of barrier layer 302. Barrier layer 302 is formed with a thickness 304 and layer 308 is formed with a thickness 312. As a non-limiting example, layer 308 may be fabricated with $Al_2O_3$. Layer 308 has been formed with thickness 312 above a top surface 306.

Barrier layer 302 and layer 308 form a layer portion 310.

When forming layer portion 310, barrier layer 302 and layer 308 form simultaneously. Since the density of barrier layer 302 is greater than layer 308, a thickness 312 of barrier Layer 308 increases at a faster rate than thickness 304 of barrier layer 302. The layer forming process initiates with zero electrical current and the current is increased. As the current is increased, the voltage on the surface of the newly forming layer portion 310 begins to increase. Surface nucleation operates to aid in generation of layer portion 310. Surface nucleation is a process where components in a solution precipitate out and form nuclei that attracted additional precipitate.

To maintain precise quality, many fabrication parameters may be controlled. In a non-limiting example, with a voltage potential of 75 Volts, thickness 304 is approximately 750 Angstroms to 800 Angstroms. Furthermore, the pH for application of layer portion 310 is controlled, wherein in an example embodiment, the pH is maintained between 5.6 and 6.2. Still further, the temperate for application of layer portion 310 is controlled, wherein in an example embodiment, the temperature is maintained between 96°-99° Celsius. With these example parameters, approximately 1 mil of layer portion 310 is formed for every 75 minutes. Accordingly, with these parameters, the time for forming 2 mils of layer portion 310 is approximately 150 minutes.

Following formation of layer portion 310, an ESC may function to process wafers in accordance with conventional systems. However, unwanted effects associated with oxidation as described with reference to FIG. 1 will be experienced as a result of the porous nature of layer 308. To prevent oxidation and the unwanted negative performance associated with the oxidation, layer 308 is treated in accordance with aspects of the present invention as discussed below with reference to FIG. 4.

Figure 4:
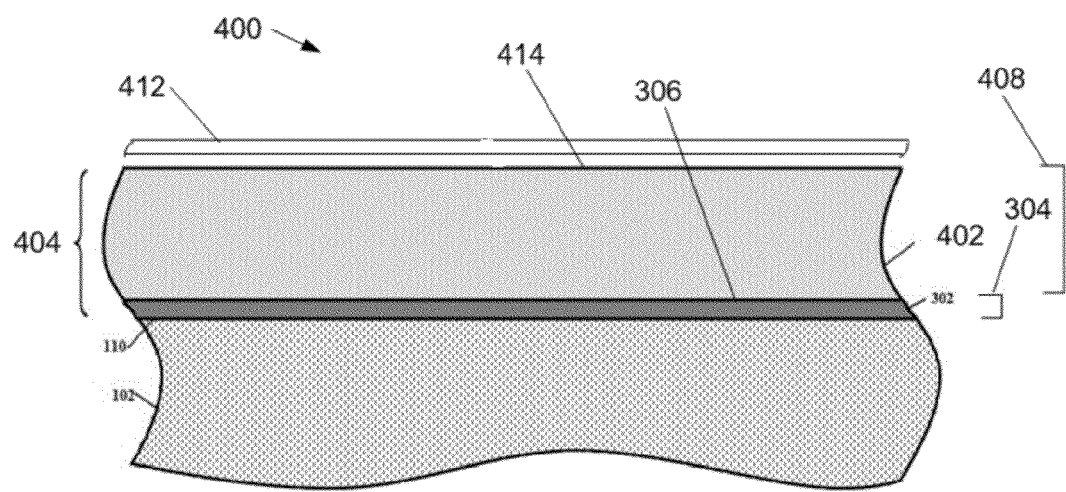
FIG. 4 illustrates a cross-sectional view of an example ESC, wherein a defective or deformed layer portion has been replaced with a functional layer portion, in accordance with an aspect of the present invention.

FIG. 4 illustrates a cross-sectional view of an example ESC 400, in accordance with an aspect of the present invention.

Refurbished ESC 400 includes electrode 102, barrier layer 302 and a layer 402.

Layer 402 has been formed by treating layer 308 (FIG. 3) with a water seal. As a non-limiting example, a water seal may be performed via application of hot deionized water.

Deionized water is produced by processing water to the point where the water is free of ions. A common method for producing deionized water is to pass a relatively pure source of water through a reverse osmosis filter. Reverse osmosis filtering may be performed by applying pressure to the water when it is located on one side of a selective membrane, resulting in solute being retained on pressurized side of membrane with deionized water passing to depressurized side of the membrane. The membrane allows small particles to pass, but larger particles, such as ions, to not pass.

Layer 402 is created via a reaction of hot deionized water with the porous $Al_2O_3$ of layer 308 (FIG. 3). The reaction of the $Al_2O_3$ with the deionized water creates AlO(OH). In some embodiments, the AlO(OH) takes the form of boehmite.

Layer 402 with thickness 408 and includes properties of high corrosion resistance for preventing corrosion and/or oxidation. Furthermore, layer 402 includes a consistent dielectric constant for avoiding failures associated with chucking or de-chucking. As a non-limiting example, a dielectric constant of 10 may be attributed to layer 402.

Pores (e.g. pore 316) as described with reference to FIG. 3 (which have the potential to cause unwanted oxidation) have been removed as illustrated by layer 402 of FIG. 4. In particular, the pores have been removed via treatment of the $Al_2O_3$ with hot water. More specifically, the $Al_2O_3$ reacts with the hot water and is converted into AlO(OH), as illustrated in FIG. 4. The AlO(OH) as illustrated in FIG. 4 is much less porous than the $Al_2O_3$ of FIG. 3, and as a result, is much less susceptible to unwanted oxidation.

The AlO(OH) of FIG. 4 retains consistent electromagnetic properties for a much longer period of time than the $Al_2O_3$ described with reference to FIG. 1.

Although the electromagnetic properties (i.e. those associated with $\in_0$ and $\mu_0$) of the AlO(OH) layer of FIG. 4 are slightly different than the electromagnetic properties of $Al_2O_3$ of FIG. 1, refurbished ESC 400 adequately performs chucking and de-chucking operations. Furthermore, refurbished ESC 400 performs chucking and de-chucking for a longer period of time and operates more efficiently over time as compared to ESC 100, which is more susceptible to oxidation.

Thickness 408 for layer 402 is greater than the thickness 304 for barrier layer 302.

The density of barrier layer 302 is greater than the density of layer 402.

The chuck force for refurbished ESC 400 is characterized by Equation (1) shown below:

$$F = (1/2) \in_o \in_r V^2 / D^2 \quad (1)$$

The variable F represents the chuck force for refurbished ESC 400, $\in_o = 8.85 \times 10^{-12}$ F/m and represents the permittivity of free space, $\in_r$, relative permittivity, represents the dielectric constant of layer 402, variable V represents the applied chuck voltage and variable D represents the thickness of the anodic film or a thickness 410.

The consistent dielectric constant associated with layer 402 results in a reliable chucking/de-chucking force as the chucking/de-chucking force is proportional to the dielectric constant as illustrated with reference to Equation (1). The consistent dielectric constant associated with layer 402 prevents a too low dielectric constant and enables proper chucking. Furthermore, the consistent dielectric constant aids in preventing high helium flow from leakage during chamber testing and wafer production as a result of a too low chucking force. Furthermore, helium may be used for controlling temperature of semiconductor process and an insufficient chucking force may result if an excessive amount of helium applied for semiconductor manufacturing process, thereby resulting in defective wafers.

For too large of a dielectric constant, water moisture becomes trapped inside pores of anodic film, resulting in poor de-chucking.

A problem that arises with the use of an ESC is the difficulty of removing the residual electrostatic force between the wafer and the ESC during "de-chucking". This residual force results from electric charges having accumulated at the interface between the wafer and the ESC support surface. One technique for de-chucking involves connecting the electrode and the wafer to ground. Another technique reverses the polarity of the DC chucking voltage applied to the electrodes to discharge the electrodes. However, these techniques are not completely effective at removing the charge on the electrodes and the wafer. Consequently, a mechanical force is often needed to overcome the remaining attractive electrostatic force due to residual charges on the electrodes and wafer. At times, the mechanical force used to release the wafer may cause the wafer to "pop", i.e., to be released from the chuck in some unpredictable manner, which may cause either wafer damage or difficulty in retrieving the wafer from unintended position. Therefore, a successful de-chucking operation is one which leaves the wafer in a state subject to acceptably low residual electrostatic attractive force without "popping" the wafer.

The voltage control of an ESC is used for the operation of the device, as the voltage differential created also generates an electric field used to attract and hold a wafer for processing. The capacitance of refurbished ESC 400 is a parameter which affects voltage control and therefore is maintained consistent in order to maintain a consistent voltage control.

The capacitance of refurbished ESC 400 is characterized by Equation (2) as shown below:

$$C = \in_o \in_r A/D \quad (2)$$

The variable C represents the capacitance of refurbished ESC 400 and variable A represents the surface area for the stop surface of the refurbished ESC 400. Furthermore, refurbished ESC 400 receives a semiconductor wafer 412 on a top surface 414 of refurbished ESC 400.

As can be observed by Equation (2), the capacitance, C, is proportional to the dielectric constant, $\in_r$, so in order to maintain a consistent capacitance, a consistent dielectric constant is maintained.

The resistance of refurbished ESC 400 is a parameter which affects arcing and therefore is consistently maintained in order to prevent arcing. In some instances, it is possible for arcing to occur as a result of a low resistance point associated with an ESC. In order to prevent arcing, resistance is maintained at a consistently high value. The permittivity, $\in$, of a material is given by Equation (3) shown below:

$$\in = \in_o \in_r \quad (3)$$

Permittivity, $\in$, is a measure of how much resistance is encountered when forming an electric field in a medium. Permittivity is a measure of how an electric field affects, and is affected by a dielectric medium. Permittivity is determined by the ability of a material to polarize in response to an electric field, and thereby reduce the total electric field inside the material. Permittivity describes a material's ability to transmit (i.e. permit) an electric field. Less electric flux exists in a medium with a high permittivity due to polarization effects. Processing of layer 402 via deionized water contributes to a permittivity such that arcing is reduced.

Figure 5:
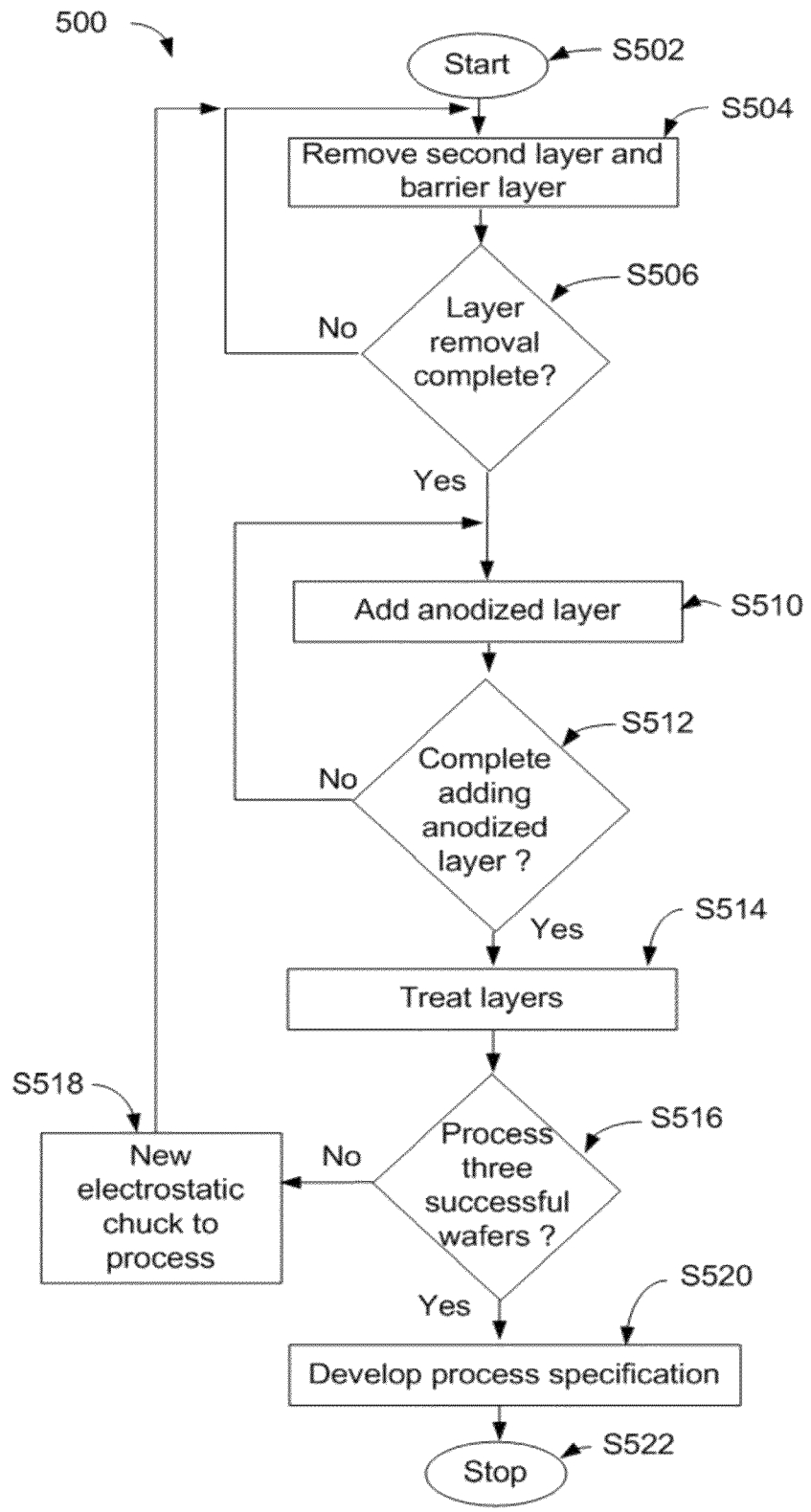
FIG. 5 illustrates an example method for refurbishing a semiconductor wafer, in accordance with an aspect of the present invention.

FIG. 5 illustrates an example method for refurbishing a semiconductor wafer, in accordance with an aspect of the present invention.

In the example embodiment, a method 500 starts (S502) and a portion of a second layer (e.g. porous layer 106 (FIG. 1)) is removed if it exists or a portion of a barrier layer (e.g. barrier layer 108 (FIG. 1)) is removed if second layer does not exist for an ESC(S504).

Removal of layers may be performed via any know means or method for removal of layers. Non-limiting examples of means and methods for removal of layer includes, mechanical, chemical and electrical.

A determination is performed as to whether the second layer and the barrier layer have been removed (S506).

Dimensions of ESC are measured using coordinate measurement machine. Based upon the measured dimensions, a determination is performed as to whether additional layer material is to be removed.

Following a determination for adequate removal of layer material (S506), ESC is configured as described with reference to FIG. 2.

A new layer portion (e.g. layer portion 310 (FIG. 3)) is added to ESC (S510).

Layer portion may be added to ESC using any known means or method.

A determination is performed as to whether addition of layer portion has been completed (S512).

Dimensions of ESC are measured using coordinate measurement machine. Based on the measured dimensions, a determination is performed as to whether additional layer material is to be added.

Following a determination for adequate addition of layer material (S512). ESC is configured as described with reference to FIG. 3.

Deionized water seal is applied to layer portion 310 (FIG. 3) (S514).

An anodic film (e.g. layer 402 (FIG. 4)) is created via a reaction of hot deionized water with the porous $Al_2O_3$ of layer 308 (FIG. 3). The reaction of the $Al_2O_3$ with the deionized water creates AlO(OH) also known as boehmite.

A determination is performed as to whether a multiplicity of wafers have been processed successfully (S516).

Measurements, testing and analysis are performed for determining whether processing of a multiplicity of wafers have been performed successfully.

For a determination of not having processed a multiplicity of wafers successfully, the process of refurbishing an ESC is initiated (S518).

An ESC previously refurbished unsuccessfully may be processed again, or an entirely different ESC which has not been attempted to be refurbished may be processed again.

For a determination of having successfully processed a multiplicity of wafers (S516), a process specification is developed.

Process specification is developed based upon the measurements and other associated information determined while successfully processing a multiplicity of wafers (S520).

Method 500 ceases operation (S522).

An ESC is subject to wear and/or degradation from conditions associated with operation. ESC may be refurbished by replacing degraded anodized layer with a new anodized layer which has been subject to a water seal for realizing an anodized layer with properties conducive to the successful operation of refurbished ESC.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of treating a bipolar ESC having an electrode with a front surface and a back surface, the front surface having an anodized layer, said method comprising: (a) eliminating the anodized layer; (b) disposing a new anodized layer onto the front surface; and (c) treating the new anodized layer with water to seal the new anodized layer, to obtain a refurbished ESC, wherein said disposing a new anodized layer onto the front surface comprises anodizing the front surface to form the new anodized layer as a first layer of $Al_2O_3$ and a second layer of $Al_2O_3$ which are formed simultaneously, and the first layer has a greater density than the second layer, wherein the first layer is in direct contact with the front surface and the second layer is an exposed layer.

2. The method of claim 1, wherein prior to disposing the new anodized layer the top surface is polished to remove 1 to 2 mils of the electrode and the new anodized layer is an upper exposed wafer supporting surface of the bipolar ESC.

3. The method of claim 2, wherein the first layer of $Al_2O_3$ has a first thickness and the second layer of $Al_2O_3$ has a second thickness, wherein the first thickness is less than the second thickness.

4. The method of claim 3, wherein said disposing a second layer of $Al_2O_3$ comprises disposing a second layer of porous $Al_2O_3$, the method further comprising measuring dimensions of the ESC, determining the thickness of the new anodized layer, and further disposing the new anodized layer until the new anodized layer has a desired thickness.

5. The method of claim 4, wherein said treating the new anodized layer with water to seal the new anodized layer comprises reacting the second layer of porous $Al_2O_3$ with the water to create AlO(OH).

6. The method of claim 5, wherein said reacting the second layer of porous $A_2O_3$ with the water to create AlO(OH) comprises reacting the second layer of porous $Al_2O_3$ with the water to create boehmite.

7. The method of claim 1, wherein said disposing a second layer of $Al_2O_3$ comprises disposing a second layer of porous $Al_2O_3$, and said treating the new anodized layer with water to seal the anodized layer comprises reacting the second layer of porous $Al_2O_3$ with the water to create AlO(OH).

8. The method of claim 7, wherein said reacting the second layer of porous $Al_2O_3$ with the water to create AlO(OH) comprises reacting the second layer of porous $Al_2O_3$ with the water to create boehmite.

9. The method of claim 1, wherein during the step of eliminating the anodized layer, the method further includes measuring dimensions of the ESC and determining whether additional material is to be removed from the front surface.

10. The method of claim 1, wherein the new anodized layer is formed by anodizing to form the first layer having a thickness of about 750 to 800 Angstroms and the second layer having a thickness of about 2 mils on the first layer.

11. The method of claim 1, wherein after the new anodized layer has been sealed, the anodized layer has a dielectric constant of about 10.

12. The method of claim 1, further comprising processing a multiplicity of wafers supported on the refurbished ESC, determining if the wafers have been successfully processed, and if the wafers have not been processed successfully, repeating (a)-(c).

* * * * *